(12) United States Patent
    Amato et al.

(10) Patent No.: US 11,209,986 B2
(45) Date of Patent: *Dec. 28, 2021

(54) MEMORY OPERATIONS ON DATA

(71) Applicant: Micron Technology, Inc., Boise, ID (US)

(72) Inventors: Paolo Amato, Pagazzano (IT); Daniele Balluchi, Cernusco sul Naviglio (IT); Danilo Caraccio, Buonalbergo (IT); Emanuele Confalonieri, Lesmo (IT); Marco Dallabora, Melegnano (IT)

(73) Assignee: Micron Technology, Inc., Boise, ID (US)

( * ) Notice: Subject to any disclaimer, the term of this patent is extended or adjusted under 35 U.S.C. 154(b) by 100 days.

This patent is subject to a terminal disclaimer.

(21) Appl. No.: 16/541,571

(22) Filed: Aug. 15, 2019

(65) Prior Publication Data

US 2019/0369878 A1      Dec. 5, 2019

Related U.S. Application Data

(63) Continuation of application No. 15/345,783, filed on Nov. 8, 2016, now Pat. No. 10,430,085.

(51) Int. Cl.
    *G06F 11/10*     (2006.01)
    *G06F 12/1009*   (2016.01)
    *G11C 16/34*     (2006.01)
    *G06F 3/06*      (2006.01)

(52) U.S. Cl.
    CPC .......... *G06F 3/0611* (2013.01); *G06F 3/0616* (2013.01); *G06F 3/0656* (2013.01); *G06F 3/0659* (2013.01); *G06F 3/0679* (2013.01); *G06F 3/0683* (2013.01); *G06F 11/1048* (2013.01); *G06F 11/1076* (2013.01); *G06F 12/1009* (2013.01); *G11C 16/3495* (2013.01);
    (Continued)

(58) Field of Classification Search
    None
    See application file for complete search history.

(56) References Cited

U.S. PATENT DOCUMENTS

| 6,094,693 A  | 7/2000 | Haneda |
| 6,363,008 B1 | 3/2002 | Wong   |
| 6,558,967 B1 | 5/2003 | Wong   |

(Continued)

FOREIGN PATENT DOCUMENTS

| CN | 1720590 A   | 1/2006 |
| CN | 102047230 A | 5/2011 |

(Continued)

OTHER PUBLICATIONS

Notice of Reasons for Rejection from related Korean patent application No. 10-2019-7015778, dated Oct. 19, 2020, 17 pages.

(Continued)

*Primary Examiner* — Phung M Chung
(74) *Attorney, Agent, or Firm* — Brooks, Cameron & Huebsch, PLLC

(57) ABSTRACT

The present disclosure includes apparatuses and methods related to memory operations on data. An example method can include executing an operation by writing a first managed unit to a second managed unit, and placing the first managed unit in a free state, wherein the first managed unit is located at a particular distance from the second managed unit.

19 Claims, 5 Drawing Sheets

(52) U.S. Cl.
CPC .......... *G06F 3/0619* (2013.01); *G06F 3/0634* (2013.01); *G06F 2212/65* (2013.01)

(56) References Cited

U.S. PATENT DOCUMENTS

| | | | |
|---|---|---|---|
| 7,120,729 | B2 | 10/2006 | Gonzalez et al. |
| 8,356,153 | B2 | 1/2013 | Franceschini et al. |
| 8,443,263 | B2 | 5/2013 | Selinger et al. |
| 9,021,275 | B1 | 4/2015 | Greenan |
| 9,122,580 | B2 | 9/2015 | Huang et al. |
| 9,158,672 | B1 | 10/2015 | Zheng et al. |
| 9,164,832 | B2 | 10/2015 | Gaertner et al. |
| 9,229,860 | B2 | 1/2016 | Matsuzawa et al. |
| 9,262,084 | B2 | 2/2016 | Brewer et al. |
| 9,390,004 | B2 | 7/2016 | Radke et al. |
| 9,436,609 | B2 | 9/2016 | Eggleston |
| 9,489,276 | B2 * | 11/2016 | Tressler ............. G11C 16/3495 |
| 9,489,302 | B2 | 11/2016 | Van Aken |
| 9,645,177 | B2 | 5/2017 | Cohen et al. |
| 9,645,919 | B2 | 5/2017 | Chen et al. |
| 9,842,059 | B2 | 12/2017 | Kamruzzaman |
| 10,445,255 | B2 * | 10/2019 | Berke ..................... G06F 13/24 |
| 10,585,597 | B2 * | 3/2020 | Fackenthal ........... G11C 11/221 |
| 2004/0128438 | A1 | 7/2004 | Regev et al. |
| 2005/0055495 | A1 | 3/2005 | Vihmalo et al. |
| 2006/0179263 | A1 | 8/2006 | Song et al. |
| 2008/0140918 | A1 | 6/2008 | Sutardja |
| 2009/0055575 | A1 | 2/2009 | Hanhimaki et al. |
| 2009/0259819 | A1 | 10/2009 | Chen et al. |
| 2010/0058127 | A1 | 3/2010 | Terao et al. |
| 2010/0169708 | A1 | 7/2010 | Rudelic et al. |
| 2010/0281202 | A1 * | 11/2010 | Abali ...................... G11C 29/82 711/103 |
| 2011/0113306 | A1 | 5/2011 | Eggleston et al. |
| 2011/0167197 | A1 | 7/2011 | Leinwander |
| 2012/0030409 | A1 | 2/2012 | Post et al. |
| 2012/0303868 | A1 | 11/2012 | Tucek |
| 2013/0219105 | A1 | 8/2013 | Confalonieri |
| 2013/0282967 | A1 | 10/2013 | Ramanujan |
| 2014/0129758 | A1 | 5/2014 | Okada et al. |
| 2015/0331793 | A1 | 11/2015 | Matsuzawa et al. |
| 2015/0339188 | A1 | 11/2015 | Hu et al. |
| 2015/0347228 | A1 | 12/2015 | Yang et al. |
| 2017/0003892 | A1 | 1/2017 | Sekido |
| 2017/0206010 | A1 | 7/2017 | Nachimuthu |
| 2018/0129423 | A1 | 5/2018 | Amato et al. |

FOREIGN PATENT DOCUMENTS

| | | |
|---|---|---|
| CN | 104008773 A | 8/2014 |
| CN | 105122218 A | 12/2015 |
| TW | 201135746 A | 10/2011 |
| TW | 201225100 A | 6/2012 |
| TW | 201235843 A | 9/2012 |
| TW | 201245960 A | 11/2012 |
| TW | 201443904 A | 11/2014 |
| TW | 201502775 A | 1/2015 |
| TW | 201510724 A | 3/2015 |
| WO | 2007070763 A2 | 6/2007 |
| WO | 2012009318 A1 | 1/2012 |
| WO | 2016088234 A1 | 6/2016 |

OTHER PUBLICATIONS

Search Report from related European patent application No. 17868874.3, dated May 27, 2020, 9 pages.

Qureshi, et al., "Enhancing lifetime and security of PCM-based main memory with start-gap wear leveling", Microarchitecture, Dec. 12, 2009, 42nd Annual IEEE/ACM International Symposium on, IEEE, Piscataway, NJ, USA, 10 pages.

Moinuddin, et al. "Enhancing Lifetime and Security of PCM-Based Main Memory with Start-Gap Wear Leveling" Proceedings of the 42nd Annual IEEE/ACM International Symposium on Microarchitecture, New York, NY, Dec. 2009, 10 pp.

Chul, et al. "A Hybrid Flash File System Based on NOR and NAND Flash Memories for Embedded Devices", In proceedings of the 8th Annual IEEE Transactions on Computers, vol. 57, Issue 7, Jul. 2008, pp. 1002-1008.

Kim, et al. "A PRAM and NAND Flash Hybrid Architecture for High-Performance Embedded Storage Subsystems", In Proceedings of the 8th ACM International Conference on Embedded Software (EMSOFT 2008), ACM, New York, NY, Oct. 2008, pp. 31-39.

International Search Report and Written Opinion from related patent aplication No. PCT/US2017/048800, dated Nov. 28, 2017, 14 pages.

Office Action from Taiwanese patent application No. 106129529, dated May 7, 2018, 18 pages.

Office Action from related Taiwanese patent application No. 106129580, dated Jan. 18, 2019, 15 pages.

International Search Report and Written Opinion from related patent application No. PCT/US2017/048806, dated Dec. 5, 2017, 14 pages.

Search Report from related European patent application No. 17869668.8, dated Sep. 9, 2019, 4 pages.

Communication pursuant to Article 94(3) EPC from related European patent application No. 17869668.8, dated Oct. 15, 2019, 6 pages.

First Office Action from related Chinese Patent Application No. 201780068786.2, dated Oct. 19, 2021, 25 pages.

* cited by examiner

| | 772 | 774 |
|---|---|---|
| 776-0 | FREE → DATA 752-6 | MU 750-0 |
| 776-1 | DATA 752-3 | MU 750-1 |
| 776-2 | DATA 752-0 | MU 750-2 |
| 776-3 | DATA 752-6 → FREE | MU 750-3 |
| 776-4 | DATA 752-2 | MU 750-4 |
| 776-5 | DATA 752-5 | MU 750-5 |
| 776-6 | DATA 752-1 | MU 750-6 |
| 776-7 | DATA 752-4 | MU 750-7 |

MEMORY OPERATIONS ON DATA

PRIORITY INFORMATION

This application is a Continuation of U.S. application Ser. No. 15/345,783, filed Nov. 8, 2016, the contents of which are incorporated herein by reference.

TECHNICAL FIELD

The present disclosure relates generally to memory devices, and more particularly, to apparatuses and methods for memory operations on data.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

BRIEF DESCRIPTION OF THE DRAWINGS

FIG. 7 illustrates a logical to physical table in accordance with a number of embodiments of the present disclosure.

DETAILED DESCRIPTION

Figure 1:
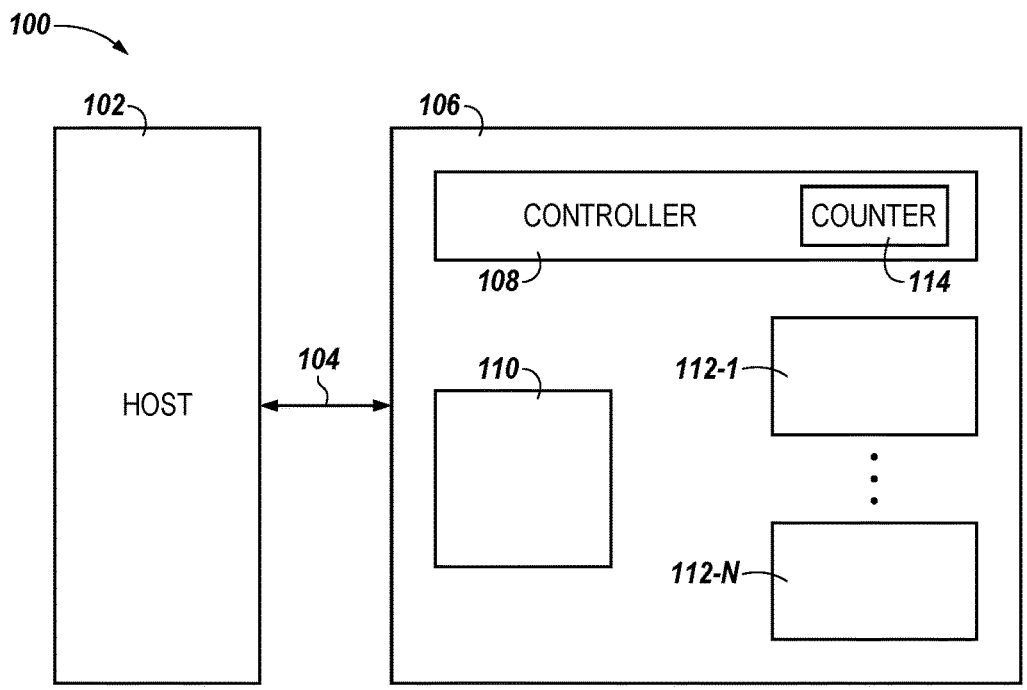
FIG. 1 is a block diagram of an apparatus in the form of a computing system including a memory device in accordance with a number of embodiments of the present disclosure.

The present disclosure includes apparatuses and methods related to memory operations on data. An example method can include executing an operation by writing data from a first managed unit to a second managed unit, and placing the first managed unit in a free state, wherein the first managed unit is located at a particular distance from the second managed unit.

Embodiments of the present disclosure can include executing an operation (e.g., wear-leveling operation) by writing data stored in one location to another location located at a particular distance from the original location continuously. For example, a number of embodiments of the present disclosure can execute a wear-leveling operation without analyzing a number of writes operations executed on each memory cell. As such, a wear-leveling operation in accordance with a number of embodiments of the present disclosure can not use additional components, such as a counter, to track a number of wear-leveling operations performed on each memory cell. Executing wear-leveling operations without tracking the number of wear-leveling operations provide benefits such as decreasing latency associated with the wear-leveling operations.

Although embodiments are not limited to a particular memory device, wear-leveling operations in accordance with a number of embodiments of the present disclosure can be executed on a hybrid memory device that includes a first memory array that can be a storage class memory and a number of second memory arrays that can be NAND Flash memory. The operation can be executed on the first memory array and/or the second number of memory array, and to increase the performance of (e.g., increase the speed, increase the reliability, and/or decrease the power consumption) of the hybrid memory.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory arrays) can refer to one or more memory arrays, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 108 may reference element "08" in FIG. 1, and a similar element may be referenced as 208 in FIG. 2. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a block diagram of an apparatus in the form of a computing system 100 including a memory device 106 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In a number of embodiments, the computing system 100 can include a number of memory devices. In the embodiment illustrated in FIG. 1, memory device 106 can include a first memory type (e.g., a first memory array 110) and a second memory type (e.g., a number of second memory arrays 112-1, . . . , 112-N). The memory device 106 can be a hybrid memory device, where memory device 106 includes the first memory array 110 that is a different type of memory than the number of second memory arrays 112-1, . . . , 112-N. The first memory array 110 can be storage class memory (SCM), which can be a non-volatile memory that acts as main memory for the memory device 106 because it has faster access time than the second number of memory arrays 112-1, . . . , 112-N. The first memory array 110 can be phase change memory (PCM), spin torque transfer (SST) memory, ferroelectric (FRAM), and/or resistive (RRAM), among other types of non-volatile memory. The second number of memory arrays 112-1, . . . , 112-N can act as a data store (e.g., storage memory) for memory device 106 and can be NAND Flash memory, among other types of memory. For example, the second number of memory arrays 112-1, . . . , 112-N can be RAM, ROM, DRAM, SDRAM, PCRAM, RRAM, and flash memory, among others.

As illustrated in FIG. 1, host 102 can be coupled to the memory device 106 via interface 104. Host 102 and memory device 106 can communicate (e.g., send commands and/or data) on interface 104. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

Memory device 106 includes controller 108 to communicate with host 102 and the first memory array 110 and the number of second memory arrays 112-1, . . . , 112-N. Controller 108 can send commands to perform operations on the first memory array 110 and the number of second memory arrays 112-1, . . . , 112-N. Controller 108 can communicate with the first memory array 110 and the number of second memory arrays 112-1, . . . , 112-N to read, write, move, and/or erase data, among other operations. Controller 108 can control a number of data flow on the memory device 106. For example, controller 108 can control writing data to the first memory array 110, writing data to the second number of memory arrays 112-1, . . . , 112-N, reading data from the first memory array 110, reading data from the number of second memory arrays 112-1, . . . , 112-N, moving data from the first memory array 110 to the number of second memory arrays 112-1, . . . , 112-N, and moving data from the number of second memory arrays 112-1, . . . , 112-N to the first memory array 110. In some embodiments, controller 108 can move data among the number of second memory arrays 112-1, . . . , 112-N.

Controller 108 can comprise a number of components including a counter 114 for executing a number of operations. For example, the counter 114 can be configured to send an initiation signal in response to a particular number of write operations being executed by the memory device, and controller 108 can initiate the operation in response to receiving the initiation signal received from the counter 114.

Host 102 includes a host controller to communicate with memory device 106. The host controller can send commands to memory device 106 via interface 104. The host controller can communicate with memory device 106 and/or the controller 108 on the memory device 106 to read, write, and erase data, among other operations.

Controller 108 on memory device 106 and/or the host controller on host 102 can include control circuitry (e.g., hardware, firmware, and/or software). In one or more embodiments, controller 108 on memory device 106 and/or the host controller on host 102 can include control circuitry can be an application specific integrated circuit (ASIC) coupled to a printed circuit board including a physical interface. Also, memory device 106 and host 102 can include a buffer of volatile and/or non-volatile memory and a number of registers.

Figure 2:
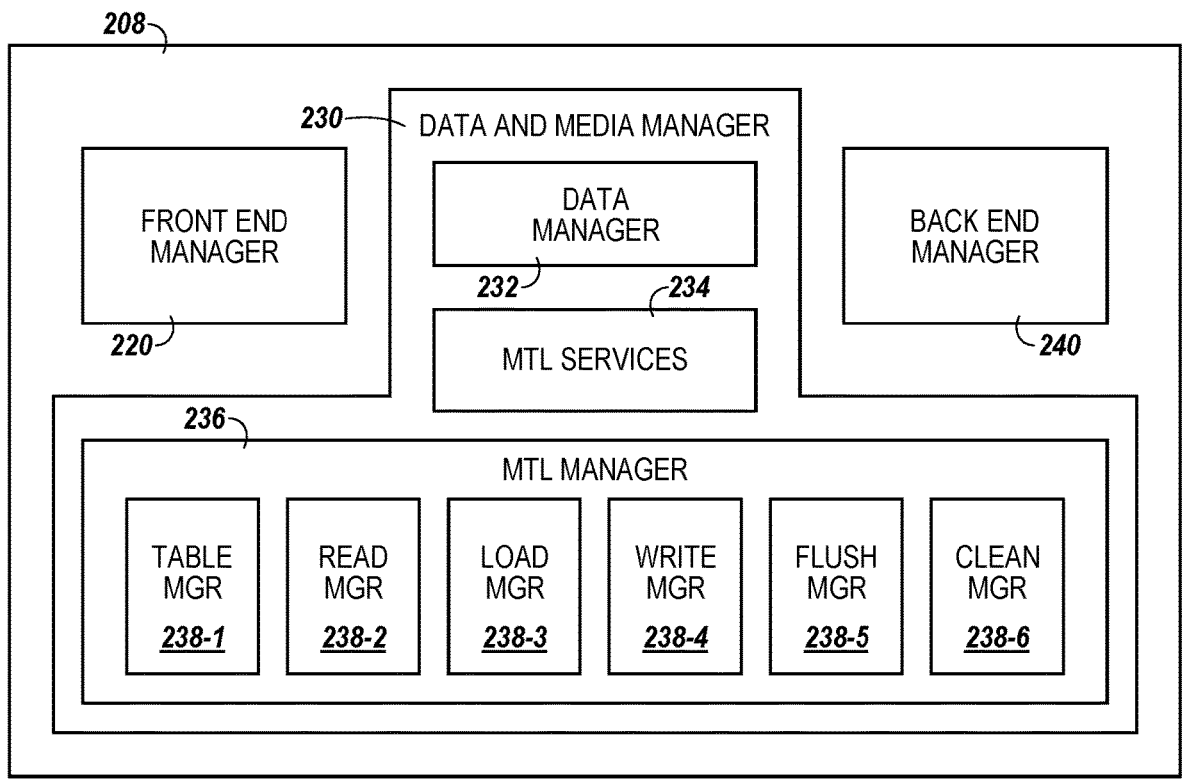
FIG. 2 is a block diagram of a controller on a memory device in accordance with a number of embodiments of the present disclosure.

FIG. 2 is a block diagram of a controller 208 in accordance with a number of embodiments of the present disclosure. Controller 208 can communicate with a host (e.g., host 102 in FIG. 1) and/or memory arrays (e.g., first memory array 110 and/or the number of second memory arrays 112-1, . . . , 112-N in FIG. 1) to read, write, move, and/or erase data to and/or from the host or memory arrays. Controller 208 includes front end manager 220, data and media manager 230, and back end manager 240.

Front end manager 220 can receive commands from a host and interprets those commands. Front end manager 220 can perform a translation of the logical addresses of data associated with the commands.

Data and media manager 230 can further process commands received from a host. Data and media manager 230 can include data manager 232, media translation layer (MTL) services 234, and media translation layer (MTL) manager 236. Data manager 232 can determine how each of the commands received from a host will be performed. MTL services 234 can include a number of sets of application programming interface (API) instructions to provide functionality to the MTL manager 236. MTL services 234 can includes API instructions to perform logical address to physical address translation, read data from memory arrays, and/or write data to memory arrays, among other services.

MTL manager 236 can include table manager 238-1, read manager 238-2, load manager 238-3, write manager 238-4, flush manager 238-5, and clean manager 238-6 to perform operations on the memory arrays.

Table manager 238-1 can provide logical address to physical address mapping for data stored in the memory arrays. The information managed by table manager 238-1 can be stored in the memory arrays. The table manager 238-1 can generate and store a logical to physical table stored the memory arrays to locate data. The logical to physical table can include a bit in the logical address to physical address mapping that indicates whether the data is stored in the first type of memory and/or the second type of memory array. The table manger 238-1 can also generate and store logical to physical pointers to locate data in the memory arrays.

Read manager 238-2 can execute read commands by locating data in the memory arrays and causing the transfer of data associated with the read commands to the host. Read manager 238-2 can also determine whether data read from a second type of memory array should remain in place and/or be moved to a first type of memory array in the memory device. If the read manager 238-2 determines that data should be moved from a second type of memory array to a first type of memory array, the read manager 238-2 notifies the load manager 238-3 to perform this operation.

Load manager 238-4 can execute moving data from a second type of memory array (e.g., NAND) to a first type of memory array (e.g., SCM). Load manager 238-4 can move the data to the first type of memory array and invalidate the original version of the data in the second type of memory array.

Write manager 238-4 can execute write commands by routing data associated with write commands to the first type of memory arrays and/or the second type of memory arrays. Write manager 238-4 can determine whether to write data to the first type of memory array, the second type of memory array, or both based on a number of criteria. The number of criteria can include the size of the data that is being written, the amount of available space in the memory arrays, and/or the frequency that data is being written to the memory arrays, among other criteria.

Flush manager 238-5 can execute moving data from a first type of memory array (e.g., SCM) to a second type of memory array (e.g., NAND). Flush manager 238-5 can move data based on a number of criteria. The criteria can be that the first type of memory array has reached a capacity threshold, for example. The flush manager 238-5 can move data to the second type of memory array and invalidate the original version of the data in the first type of memory array.

Clean manager 238-6 can execute move data from a first location in the first type of memory array (e.g., SCM) to a second location in the first type of memory array. Clean manager 238-6 can move data as a wear leveling operation so that particular physical locations in the first type of memory array are not written more often than other physical locations. Clean manager 238-6 can execute writing each bit of a managed unit to a particular logical state on each managed unit that has an invalid status. In a number of embodiments, clean manager 238-6 can include programming each bit of a managed unit to a logical state that uses more power and/or has a higher latency than another logical state.

Figure 3:
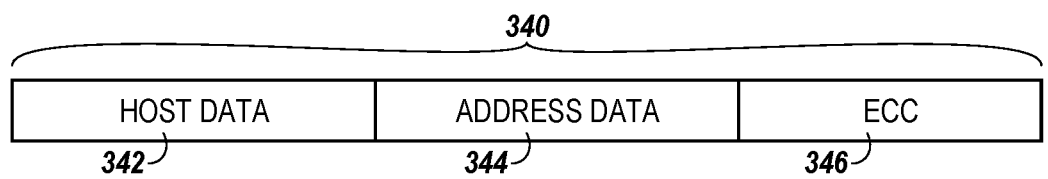
FIG. 3 illustrates an example managed unit on a memory device in accordance with a number of embodiments of the present disclosure.

FIG. 3 illustrates an example managed unit 340 on a memory device in accordance with a number of embodiments of the present disclosure. As used herein, a managed unit refers to a group of memory cells in an array that are managed together during operations. The size of a managed unit can vary based on the type of data stored in the managed unit and/or the type of operation performed on the managed unit. For example, one managed unit (e.g., large managed unit) can include 4 KB of data and store data from a host, while another managed unit can include 64B of data and can store a logical to physical table associated with the data in the large managed unit.

The example managed unit 340 may include data comprising host data 342, address data 344, and error correction (ECC) data 346 (e.g., parity bits), as illustrated in FIG. 3. Although not illustrated in FIG. 3, the data may also comprise other types of data such as metadata.

The example managed unit 340 can have a status associated therewith. For example, the example managed unit 340 can have a status of valid, invalid, free, or do not use. A valid managed unit includes the most recent version data. An invalid managed unit includes data that is not the most recent version of the data. A "do not use" managed unit is not used to store data for a particular reason, such as the managed unit is no longer able to reliably store data. A free managed unit includes memory cells that are in a predetermined state (e.g., erased state or reset state) and are ready to be programmed (e.g., written to). For example, a reset state can be where all memory cells of managed unit are programmed to a particular logical state (e.g., logical state 0 or logical state 1, for example).

Figure 4:
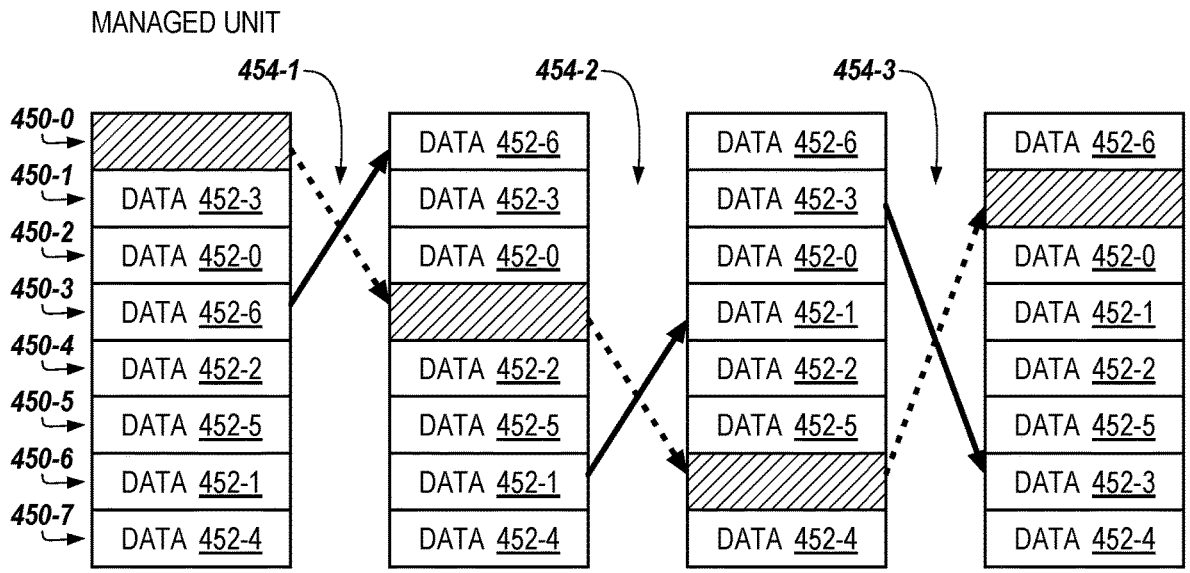
FIG. 4 illustrates a number of wear-leveling operations performed on a number of managed units in accordance with a number of embodiments of the present disclosure.

FIG. 4 illustrates a number of wear-leveling operations 454-1, 454-2, and 454-3 executed on a number of managed units 450-0, 450-1, 450-2, 450-3, 450-4, 450-5, 450-6, and 450-7 in accordance with a number of embodiments of the present disclosure. The number of managed units illustrated in FIG. 4 may include 8 managed units, and 7 of the number of managed units may store a set of data while one managed unit is in a free state.

Data stored in each managed unit can comprise address data (e.g., address data 344) that is assigned a particular logical address, and a memory device (e.g., controller 108) may be configured to figure out where in the managed units stored data is located based on the logical address of the address data. For example, a controller can read and decode address data stored in a managed unit 450-1, and conclude that data 452-3 is currently stored in the managed unit 450-1.

A number of managed units prior to a first operation 454-1 includes a managed unit 450-0 placed in a free state, and managed units 450-1, 450-2, 450-3, 450-4, 450-5, 450-6, and 450-7 storing corresponding data 452-3, 452-0, 452-6, 452-2, 452-5, 452-1, and 452-4, respectively. In each wear-leveling operation, data can be written from a first managed unit located at a particular distance from a second managed unit to a second managed unit, and the first managed unit can be placed in a free state after the operation. As used herein, a distance (e.g., a particular distance) refers to a number of managed units to be counted from a managed unit to reach to another managed unit located at the distance from the managed unit. For example, as illustrated in FIG. 4, a second managed unit (e.g., 450-0) located at a distance of 3 from a first managed unit (450-3) indicates that 3 managed units (e.g., 450-0, 450-1, and 450-2) are to be counted to reach to the first managed unit (450-3). Although embodiments are not limited, a particular distance can be a relative prime number with respect to a number of managed units. A particular number is a relative prime number with respect to a number of managed units if the particular number shares no common positive factor (e.g., divisor) other than 1 with the number of managed units. For example, when there are 8 managed units (as illustrated in FIG. 4), a particular distance can be 3, 5, and 7 since those numbers (3, 5, and 7) share no common positive divisors other than 1 with 8. A particular distance may be predetermined prior to executing wear-leveling operations, although embodiments are not limited so.

A first wear-leveling operation 454-1 starts with the managed unit 450-3 located at the distance of 3 from the managed unit 450-0 placed in a free state. The first wear-leveling operation 454-1 writes data 452-6 stored in the managed unit 450-3 to the managed unit 450-0, as illustrated in FIG. 4. Upon writing data 452-6 to the managed unit 450-0 from the managed unit 450-3, the managed unit 450-3 can be placed in a free state, and the managed unit 450-0 can be placed in a valid state.

A managed unit that is placed in a free state in a previous wear-leveling operation is excluded from a number of non-wear leveling writing operation executed in a memory device until a next wear-leveling operation. For example, memory device (e.g., memory device 106) may executing a number of non-wear-leveling write operations on a number of managed units 450-0, 450-1, 450-2, 450-4, 450-5, 450-6, and 450-7 except on the managed unit 450-3. As such, a number of embodiments ensure that the managed unit 450-3 is not overwritten by not writing data to the managed unit 450-3 placed in a free state until a next wear-leveling operation.

Each wear-leveling operation can be triggered based on a number of responses or standards. In some embodiments, a counter (e.g., counter 114) can be configured to send an initiation signal in response to a particular number of writes operations being executed by a memory device, and a controller can be configured to execute a wear-leveling operation in response to the initiation signal received from a counter. In some embodiments, the controller can be configured to execute a wear-leveling operation in response to a particular number of power state transitions (e.g., from active to idle, stand-by, or power down) occurring in a memory device.

The second wear-leveling operation 454-2 can start with the managed unit 450-6 located at the distance of 3 from the managed unit 450-3 that is placed in a free state as a result of the first wear-leveling operation 454-1. The second wear-leveling operation 454-2 writes the data 452-1 from the managed unit 450-6 to the managed unit 450-3 that is placed in a free state in a previous operation. Upon writing the data 452-1 to the managed unit 450-3, the managed unit 450-6 can be placed in a free state, and the managed unit 450-3 can be placed in a valid state.

A third wear-leveling operation 454-3 can start with the managed unit 450-1. As illustrated in FIG. 4, embodiments can sequentially search for a next managed unit of the number of managed units (e.g., 450-0, 450-1, 450-2, 450-3, 450-4, 450-5, 450-6, and 450-7). For example, since there are no more managed unit beyond the managed unit 450-7, the third wear-leveling operation 454-3 can continues counting the distance from the managed unit 450-0 upon counting the managed unit 450-7. As such, embodiments can count the managed unit 450-7, 450-0, and 450-1 for the distance of 3 such that the operation can be executed on the managed unit 450-1. Therefore, the third-wear leveling operation 454-3 being executed on managed unit 450-1 can write data 452-3 (stored in the managed unit 450-1) to managed unit 450-6 that is placed in a free state in a previous operation. Upon writing the data 452-3 to the managed unit 450-6, the managed unit 450-1 can be placed in a free state, and the managed unit 450-6 can be placed in a valid state.

Figure 5:
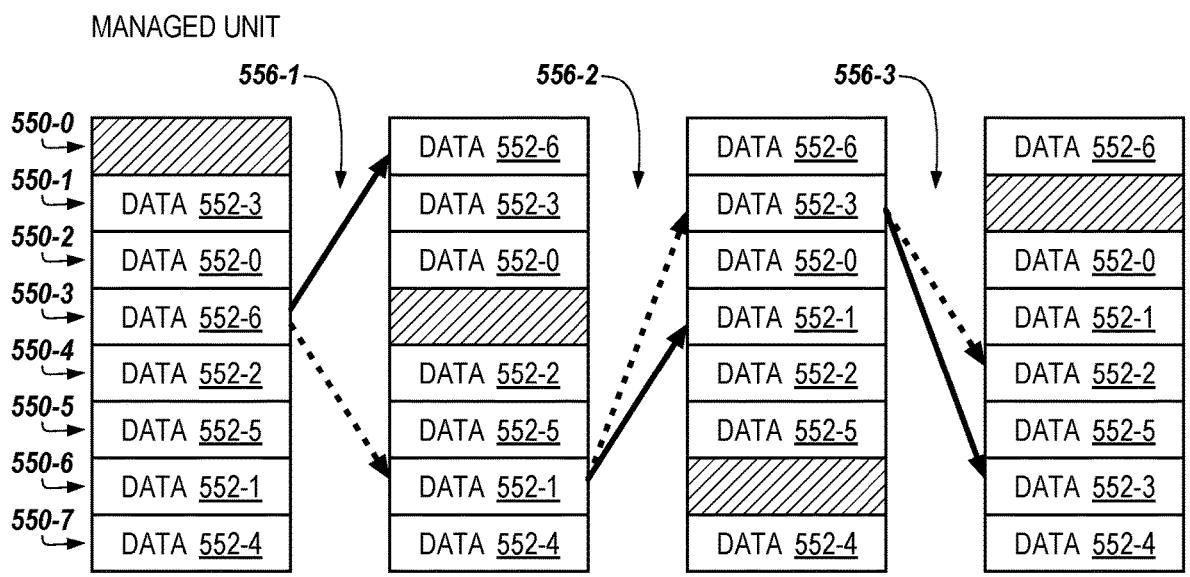
FIG. 5 illustrates a number of wear-leveling operations performed on a number of managed units in accordance with a number of embodiments of the present disclosure.

FIG. 5 illustrates a number of wear-leveling operations 556-1, 556-2, and 556-3 executed on a number of managed units 550-0, 550-1, 550-2, 550-3, 550-4, 550-5, 550-6, and 550-7 in accordance with a number of embodiments of the present disclosure. The number of managed units 550-0, 550-1, 550-2, 550-3, 550-4, 550-5, 550-6, and 550-7 may be analogous to those illustrated in connection with FIG. 4.

A number of managed units prior to a first operation 556-1 includes a managed unit 550-0 placed in a free state, and other managed units 550-1, 550-2, 550-3, 550-4, 550-5, 550-6, and 550-7 storing corresponding data 552-3, 552-0, 552-6, 552-2, 552-5, 552-1, and 552-4, respectively. In each operation, a first managed unit that is indicated by the write cursor (e.g., dotted line as illustrated in FIG. 5) is written to a managed unit that is placed in a free state, and upon completing of the writing the data to the managed unit that is in a free state, the first managed unit is placed into a free state. After each operation, the write cursor is placed at a second managed unit that is located at a particular distance from the first managed unit. As illustrated in FIG. 5, the operation is described by a bold line, and the write cursor is described by a dotted line.

A first wear-leveling operation 556-1 starts with the managed unit 550-3. The write cursor of the first wear-leveling operation 556-1 can placed at the managed unit 550-3 prior to executing the first wear-leveling operation 556-1 (although not shown in FIG. 5), and the first wear-leveling operation 556-1 writes the data 552-6 stored in the managed unit 550-3 (previously indicated by the write cursor) to the managed unit 550-0 that is placed in a free state. Upon completing of writing the data to the managed unit 550-0, the managed unit 550-3 can be placed in a free state, and the managed unit 550-0 can be placed in a valid state.

The write cursor can be updated upon a completion of the first wear-leveling operation 556-1. For example, the write cursor can be updated to be placed at the managed unit 550-6 located at a particular distance (e.g., distance of 3 as described in connection with FIG. 5) from the managed unit 550-3. Therefore, a second wear-leveling operation 556-2 can start from the managed unit 550-6 indicated by the write cursor upon the completion of the first wear-leveling operation 556-1. The second wear-leveling operation 556-2 writes the data 552-1 stored in the managed unit 550-6 to the managed unit 550-3 that is placed in a free state during the first wear-leveling operation 556-1.

A wear-leveling operation may also employ an index system. A memory device (e.g., controller 108) may sequentially assign each managed unit a particular index, and update the index in each operation to determine where to start the wear-leveling operation from. For example, each managed unit 550-0, 550-1, 550-2, 550-3, 550-4, 550-5, 550-6, 550-7 may be sequentially assigned a corresponding index 0, 1, 2, 3, 4, 5, 6, and 7, respectively, and the controller may be configured to initiate each operation at a particular index that is greater than a previous starting index by a particular (e.g., predetermined) distance. As an example, the controller may initiate another wear-leveling operation at index 3 when a previous wear-leveling operation initiated at index 0 if a particular distance is determined to be 3.

The write cursor, upon completing the second wear-leveling operation 556-2, can be updated to indicate at a different managed unit. A wear-leveling operation may search for an updated managed unit at a different side of the number of managed units when a particular distance (with a particular vector) from a managed unit exceeds the number of managed units. For example, the write cursor, in FIG. 5, has been searching for an updated managed unit by counting a particular distance in a downward direction of the number of managed units. During the second wear-leveling operation 556-2, when the write cursor can no longer search for the update managed unit in the downward direction (since there is only one managed unit below the managed unit 550-6), the write cursor may continue counting the particular distance from the other side of the number of managed units. For example, the write cursor may count the managed unit 550-7, and further count 550-0 and 550-1 from the other side of the number of managed units. As a result, a number of counted managed units 550-7, 550-0 and 550-1 amounts to a particular distance of 3, and the write cursor is placed at the managed unit 550-1. Therefore, the third wear-leveling operation 556-3 can write the data 552-3 stored in the managed unit 550-1 indicated by the write cursor to the managed unit 550-6 that is placed in a free state during the second wear-leveling operation 556-2, and place the managed unit 550-1 in a free state upon a competing of the writing the data 552-3 to the managed unit 550-6. Upon a completion of the third wear-leveling operation 556-3, the write cursor can be updated to indicate a next managed unit (e.g., the managed unit 550-4 including the data 552-2) located at a particular distance from the managed unit 550-1.

Figure 6:
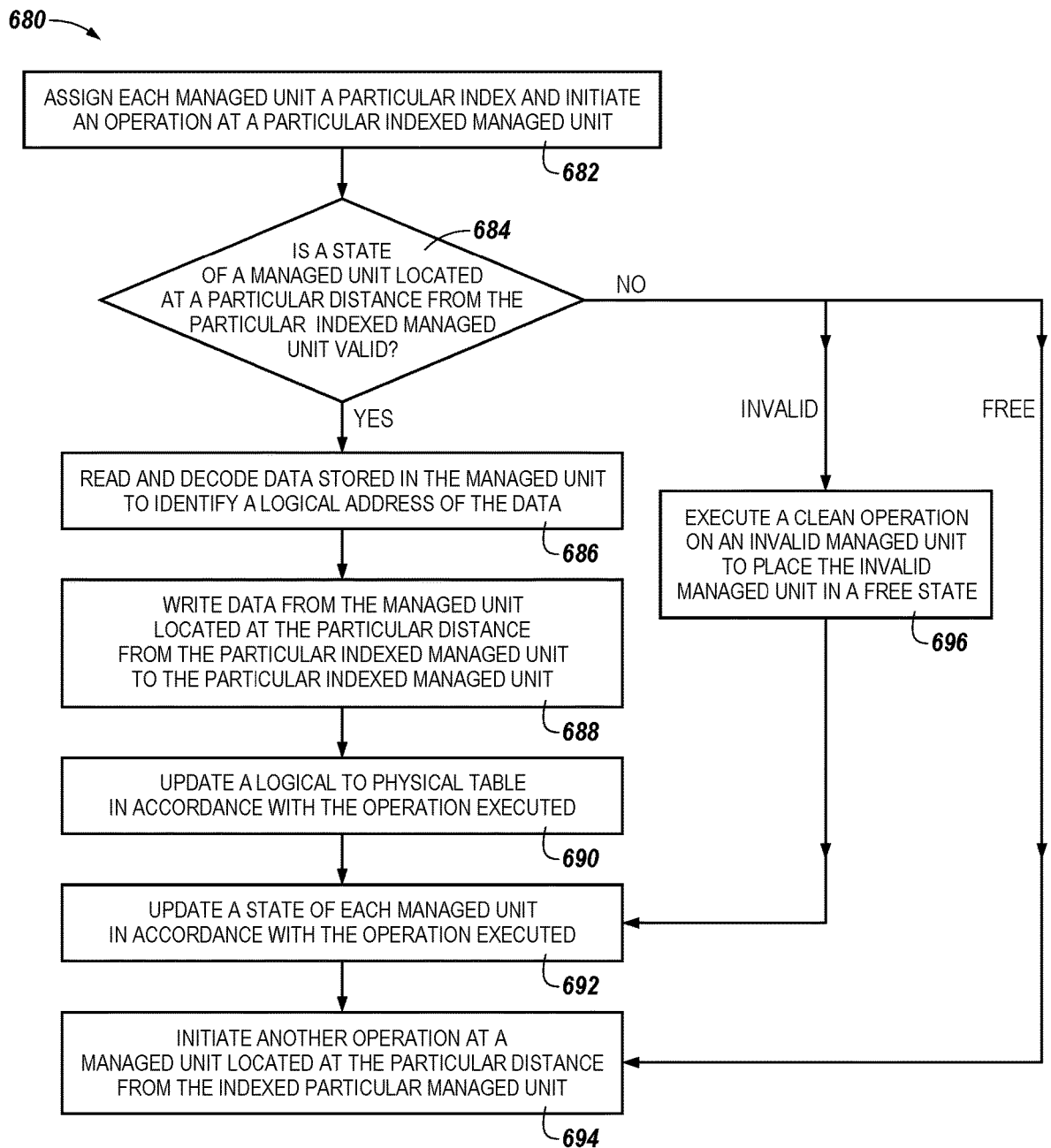
FIG. 6 illustrates a diagram of an example of a method for a wear-leveling operation on a memory device in accordance with a number of embodiments of the present disclosure.

FIG. 6 illustrates a diagram of an example of a method 680 for a wear-leveling operation on a memory device in accordance with a number of embodiments of the present disclosure. Method can be performed by, for example, controller 108 and/or 208 previously described in connection with FIGS. 1 and 2, respectively.

At block 682, method 680 includes assigning each managed unit a particular index and initiate an operation at a particular indexed managed unit. For example, a controller can be configured to assign each managed unit a particular index and initiate an operation at a managed unit that is assigned an index 0.

At block 684, method 680 includes determining whether a state of a managed unit located at a particular distance from the particular indexed managed unit is valid. When the controller initiated the operation from the managed unit of index 0, for example, then the controller can determine a state of a managed unit of index 3 if a particular distance is predetermined to be 3.

If it is determined that the state of the managed unit located at the particular distance from the particular indexed managed unit is valid, then method 680 proceeds to block 686. At block 686, method 680 includes reading and decoding data stored in the managed unit to identify a logical address of the data. A logical address can be identified based on address data (e.g., address data previously described in connection with FIG. 3) of the data stored in the managed unit being examined (e.g., by a controller).

At block 688, method 680 includes writing data from the managed unit located at the particular distance from the particular indexed managed unit to the particular indexed managed unit. For example, when the controller initiated the operation on the managed unit of index 0 and the particular distance is predetermined to be 3, then the controller can write the data stored in the managed unit of index 3 (e.g., a first managed unit) to the managed unit of index 0 (e.g., a second managed unit). Upon writing the data, method 680 includes updating a logical to physical table in accordance with the operation executed at block 690, as will be further described in connection with FIG. 7. Further, method 680 includes updating a state of each managed unit in accordance with the operation executed at block 692. For example, when the controller writes the data stored in the managed unit of index 3 to the managed unit of index 0, the controller may place the managed unit of index 0 in a valid state (e.g., indicating that the managed unit of index 0 is now actively involved in a number of non-wear leveling write operations being executed on a memory device), and the managed unit of index 3 in a free state (e.g., indicating that the managed unit of index 3 is no longer actively involved in a number of non-wear leveling write operations being executed on a memory device). Upon updating a state of each managed unit involved in the operation, and the logical to physical table, method 680 can initiate another operation at the managed unit located at the particular distance from the particular indexed managed unit at block 694. For example, the controller may initiate another operation at the managed unit of index 3, and determine a state of a managed unit of index 6 that is located at a particular (e.g., predetermined) distance from the managed unit of index 3.

Method 680 can also include skipping the operation (e.g., those described in blocks 686, 688, 690) when a state of the managed unit (e.g., a first managed unit) located at the particular distance from the particular indexed managed unit (e.g., a second managed unit) is in a free or invalid state, and checking a state of a third managed unit that is located at the particular distance from the managed unit (e.g., a first managed unit). That is, method 680 can initiate another operation at block 694 on the third managed unit if it is determined, at block 684, that the managed unit located at the particular distance from the particular indexed managed unit is in a free or invalid state.

If it is determined, at block 684, that the managed unit located at the particular distance from the particular indexed managed unit is in an invalid state, method 680 can execute a clean operation on an invalid managed unit to place the invalid managed unit in a free state, at block 696. For example, if the managed unit of index 3 being examined by the controller is determined to be in an invalid state, the controller can execute the clean operation on the managed unit of index 3, and place the managed unit of index 3 in a free state. However, embodiments are not so limited. For example, if it is determined that the managed unit is in an invalid state, the method may include, as illustrated at block 694, initiating another operation at a managed unit located at the particular distance from the particular indexed managed unit as if the managed unit is placed in a free state. That is, in some embodiments, method may not execute the clean operation when the managed unit is placed in an invalid state.

FIG. 7 illustrates a logical to physical table 770 in accordance with a number of embodiments of the present disclosure. The logical to physical table 770 may include rows and columns, where each row 776-0, 776-1, 776-2, 776-3, 776-4, 776-5, 776-6, and 776-7, can correspond to a separate table entry. As such, each row 776-0, 776-1, 776-2, 776-3, 776-4, 776-5, 776-6, and 776-7 includes a logical address 772 of each data and a physical address 774 of each managed unit. Although the logical to physical table 770 includes 8 rows, embodiments are not so limited. For example, the logical to physical table 770 can include as many rows as a number of managed units a memory device includes.

A memory device (e.g., controller 108) can be configured to update the logical to physical table 770 in accordance with the wear-leveling operation executed on a number of managed units. For example, FIG. 7 illustrates updating the logical to physical table in accordance with the wear-leveling operation being executed on a managed unit 750-0 that is placed in a free state. In this particular wear-leveling operation, data 752-6 stored in a managed unit 750-3, which is located at a particular distance from the managed unit 750-0, can be written to the managed unit 750-0. Upon writing the data 752-6 to the managed unit 750-0, the managed unit 750-0 and 750-3 can be placed in a valid and a free state, respectively. The logical to physical table 770 can be updated upon completing the example wear-leveling operation by updating a first row 772-1 from "FREE" to "DATA 752-6" and a fourth row from "DATA 752-6" to "FREE." This update shows that the data 752-6 has moved from the managed unit 750-3 to the managed unit 750-0, and the managed unit 750-3 no longer stores the corresponding data after the wear-leveling operation. The logical to physical table 770 can be updated in each operation, and used to identify a logical address of data stored in a particular managed unit. For example, the controller can be configured to use the logical to physical table 770 to identify that data 752-2 (corresponding to row 776-4 and column 772) is stored in a managed unit 750-4 (corresponding to row 776-4 and column 774).

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    performing a wear-leveling operation by:
        determining, by a controller, that a first managed unit is located a particular distance from a second managed unit, wherein the particular distance indicates a count of a number of managed units physically between two managed units;
        executing, by the controller, an operation by writing data from the first managed unit to the second managed; and
        preventing the data from being written from the first managed unit to the second managed unit unless the first managed unit is determined, prior to the execution of the operation, to be in a valid state.

2. The method of claim 1, further comprising placing, by the controller, the second managed unit in a valid state subsequent to executing the operation.

3. The method of claim 1, further comprising placing, by the controller, the first managed unit in a free state subsequent to executing the operation.

4. The method of claim 1, further comprising selecting the particular distance among a number of relative prime numbers with respect to a total number of managed units.

5. The method of claim 1, further comprising not performing a memory operation on the first managed unit at least until a next wear-leveling operation.

6. The method of claim 1, further comprising performing another wear-leveling operation by:
    checking a state of a third managed unit that is located at the particular distance from the first managed unit; and
    in response to the third managed unit being in a valid state, executing another operation by writing data from the third managed unit to the first managed unit.

7. The method of claim 6, further comprising:
    performing, in response to the third managed unit being in an invalid state, a clean operation on the third managed unit without executing the another operation.

8. An apparatus, comprising:
    a number of memory arrays including a first managed unit and a second managed unit; and
    a controller coupled to the number of memory arrays and configured to:
        identify the first managed unit is in a free state;
        sequentially search, in response to identifying that the first managed unit is in a free state, a second managed unit that is located a particular distance from the first managed unit, wherein the particular distance corresponds to a count of a number of managed units physically between the first managed unit and the second managed unit;
        execute, in response to determining that the second managed unit is located the particular distance from the first managed unit, an operation by writing data from the second managed unit to the first managed; and
        prevent the data from being written from the second managed unit to the first managed unit unless the second managed unit is determined, prior to the execution of the operation, to be in a valid state.

9. The apparatus of claim 8, wherein the controller is further configured to place, subsequent to the execution of the operation, the second managed unit in a free state.

10. The apparatus of claim 8, wherein the controller is further configured to place, subsequent to the execution of the operation, the first managed unit in a valid state.

11. The apparatus of claim 8, wherein the controller is further configured to, subsequent to writing the data from the second managed unit to the first managed unit:
    identify a third managed unit located the particular distance from the second managed unit; and
    write, in response to the third managed unit being in a valid state, data from the third managed unit to the second managed unit.

12. The apparatus of claim 8, wherein the controller is further configured to:
    skip, in response to the third managed unit not being in a valid state, writing the data from the second managed unit to the third managed unit; and
    sequentially search for a next managed unit that is located the particular distance from the third managed unit.

13. The apparatus of claim 8, wherein the controller comprises a logical to physical table, and the controller is further configured to identify a physical location of each of a plurality of managed units of the number of memory arrays based on the logical to physical table.

14. The apparatus of claim 8, wherein the controller is configured to sequentially assign each of a plurality of managed units of the number of memory arrays a corresponding index.

15. The apparatus of claim 14, wherein the controller is configured to determine the particular distance between two managed unit of the plurality of managed units based on an index assigned to a corresponding one of the plurality of managed units.

16. A method, comprising:
performing a wear-leveling operation by:
- executing, by a controller, an operation, in response to identifying a first managed unit indicated by a write cursor, by writing data from the first managed unit to a second managed unit in a free state;
- updating, by the controller, a location of the write cursor to the second managed unit in response to determining that the second managed unit is located at a particular distance from the first managed unit, wherein the particular distance corresponds to a count of a number of managed units physically between the first managed unit and the second managed unit; and
- prevent the data from being written from the first managed unit to the second managed unit unless the first managed unit is determined, prior to the execution of the operation, to be in a valid state.

17. The method of claim 16, further comprising placing the first managed unit in a free state subsequent to writing the data from the first managed unit to the second managed unit.

18. The method of claim 16, further comprising determining the particular distance prior to performing the wear-leveling operation.

19. The method of claim 18, further comprising performing another wear-leveling operation by executing, in response to the first managed unit being placed in a free state, an operation by writing data stored in the second managed unit to the first managed unit.

* * * * *